US012604779B2

(12) United States Patent
Lee

(10) Patent No.: US 12,604,779 B2
(45) Date of Patent: Apr. 14, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventor: Seokhyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 18/212,514

(22) Filed: Jun. 21, 2023

(65) Prior Publication Data

US 2024/0105689 A1 Mar. 28, 2024

(30) Foreign Application Priority Data

Sep. 26, 2022 (KR) ........................ 10-2022-0121731

(51) Int. Cl.
*H01L 23/00* (2006.01)
*H01L 23/498* (2006.01)
(Continued)

(52) U.S. Cl.
CPC ...... *H01L 25/105* (2013.01); *H01L 23/49816* (2013.01); *H01L 23/49822* (2013.01);
(Continued)

(58) Field of Classification Search
CPC ............. H01L 25/105; H01L 23/49816; H01L 23/49822; H01L 23/49833;
(Continued)

(56) References Cited

U.S. PATENT DOCUMENTS

| | | |
|---|---|---|
| 10,157,852 B2 | 12/2018 | Yu et al. |
| 10,410,969 B2 | 9/2019 | Lin et al. |

(Continued)

FOREIGN PATENT DOCUMENTS

| | | |
|---|---|---|
| KR | 1020200002229 A | 1/2020 |
| KR | 1020220042028 A | 4/2022 |
| KR | 1020220117032 A | 8/2022 |

OTHER PUBLICATIONS

Korean Office Action corresponding to Korean Patent Application No. 10-2022-0121731, dated Feb. 2, 2026.

*Primary Examiner* — Elias Ullah
(74) *Attorney, Agent, or Firm* — Sughrue Mion, PLLC

(57) ABSTRACT

A semiconductor package includes: a lower redistribution wiring layer having: a first chip mounting region; a peripheral region, and lower redistribution wirings; a logic semiconductor chip mounted in the first chip mounting region, the logic semiconductor chip having a plurality of first through electrodes that are electrically connected to at least some of the lower redistribution wirings; a first sealing member covering the logic semiconductor chip, a plurality of conductive connectors penetrating the first sealing member in the peripheral region; an upper redistribution wiring layer provided on the first seal and having upper redistribution wirings that are electrically connected to the plurality of conductive connectors, the upper redistribution wiring layer having at least one second chip mounting region that overlaps at least a portion of the first chip mounting region; and at least one memory semiconductor chip mounted in the second chip mounting region using first and second conductive bumps.

20 Claims, 15 Drawing Sheets

(51) Int. Cl.

| | |
|---|---|
| *H01L 25/00* | (2006.01) |
| *H01L 25/10* | (2006.01) |
| *H10B 80/00* | (2023.01) |

(52) U.S. Cl.
CPC .. *H01L 23/49833* (2013.01); *H01L 23/49838* (2013.01); *H01L 24/08* (2013.01); *H01L 24/16* (2013.01); *H01L 24/32* (2013.01); *H01L 24/73* (2013.01); *H01L 25/50* (2013.01); *H10B 80/00* (2023.02); *H01L 2224/08225* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1431* (2013.01); *H01L 2924/1436* (2013.01)

(58) Field of Classification Search
CPC ... H01L 23/49838; H01L 24/08; H01L 24/16; H01L 24/32; H01L 24/73; H01L 25/50; H01L 2224/08225; H01L 2224/16145; H01L 2224/16227; H01L 2224/32145; H01L 2224/32225; H01L 2224/73204; H01L 2225/1023; H01L 2225/1041; H01L 2225/1058; H01L 2924/1431; H01L 2924/1436; H01L 24/82; H01L 25/0652; H01L 2225/06565; H01L 2225/06572; H01L 2225/06589; H01L 23/5389; H01L 24/14; H01L 2225/06513; H01L 2225/06517; H01L 2225/06524; H01L 2225/06548; H01L 24/17; H01L 2225/06541; H01L 24/13; H01L 25/18; H01L 23/3185; H01L 23/481; H01L 24/04; H01L 24/07; H01L 2224/02331; H01L 2224/02333; H01L 2224/02371; H01L 2224/02372; H01L 2224/02379; H01L 2224/02381; H10B 80/00

See application file for complete search history.

(56) References Cited

U.S. PATENT DOCUMENTS

| | | | |
|---|---|---|---|
| 11,239,219 | B2 | 2/2022 | Kim |
| 11,270,941 | B2 | 3/2022 | Seidemann et al. |
| 2020/0098621 | A1 | 3/2020 | Bharath et al. |
| 2021/0066279 | A1 | 3/2021 | Yu et al. |
| 2021/0358894 | A1 | 11/2021 | Gu et al. |

SEMICONDUCTOR PACKAGE AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2022-0121731, filed on Sep. 26, 2022 in the Korean Intellectual Property Office, the disclosure of which is incorporated by reference herein in its entirety.

BACKGROUND

1. Field

Example embodiments relate to a semiconductor package and a method of manufacturing the semiconductor package, and more particularly, to a semiconductor package including a plurality of stacked different semiconductor chips and a method of manufacturing the same.

2. Description of Related Art

In System in Package (SiP) technology, a plurality of semiconductor chips may be provided on one interposer and may be spaced apart from each other. However, because the interposer is manufactured using Through Silicon Via (TSV) technology, manufacturing cost may be high. The interposer may use conductive wirings to electrically connect the semiconductor chips and to transmit data signals. The conductive wirings of the interposer may increase an interconnection length between the semiconductor chips, and the increased interconnection length may generate resistance and may reduce a performance of the semiconductor device.

SUMMARY

One or more example embodiments provide a semiconductor package including a structure that may reduce manufacturing cost and may reduce a distance between semiconductor chips.

One or more example embodiments also provide a method of manufacturing the semiconductor package.

According to an aspect of an example embodiment, a semiconductor package, includes: a lower redistribution wiring layer including: a first chip mounting region; a peripheral region provided at a periphery of the first chip mounting region; and lower redistribution wirings; a logic semiconductor chip mounted in the first chip mounting region, wherein the logic semiconductor chip includes a plurality of first through electrodes that are electrically connected to at least some of the lower redistribution wirings; a first sealing member covering the logic semiconductor chip, wherein the first sealing member is provided on the lower redistribution wiring layer; a plurality of conductive connectors penetrating the first sealing member in the peripheral region, wherein the plurality of conductive connectors are electrically connected to at least some of the lower redistribution wirings; an upper redistribution wiring layer provided on the first seal, wherein the upper redistribution wiring layer includes upper redistribution wirings that are electrically connected to the plurality of conductive connectors, and wherein the upper redistribution wiring layer includes at least one second chip mounting region that overlaps at least a portion of the first chip mounting region when viewed from a plan view; and at least one memory semiconductor chip mounted in the at least one second chip mounting region using first conductive bumps and second conductive bumps, wherein the first conductive bumps are provided in the first chip mounting region and the at least one second chip mounting region, wherein the first conductive bumps are electrically connected to the plurality of first through electrodes, and wherein the second conductive bumps are provided in the peripheral region and are electrically connected to the plurality of conductive connectors.

According to an aspect of an example embodiment, a semiconductor package, includes: a lower redistribution wiring layer including: a first chip mounting region; a peripheral region provided at a periphery of the first chip mounting region; lower redistribution wirings; and bonding pads electrically connected to the lower redistribution wirings; a logic semiconductor chip mounted in the first chip mounting region, wherein the logic semiconductor chip includes a plurality of first through electrodes that are electrically connected to at least some of the lower redistribution wirings; a first sealing member covering the logic semiconductor chip, wherein the first sealing member is provided on the lower redistribution wiring layer; a plurality of conductive connectors penetrating the first sealing member in the peripheral region, wherein the plurality of conductive connectors are electrically connected to at least some of the lower redistribution wirings; an upper redistribution wiring layer provided on the first seal, wherein the upper redistribution wiring layer includes: upper redistribution wirings that are electrically connected to the plurality of conductive connectors; a second chip mounting region; and a third chip mounting region, wherein the second chip mounting region overlaps at least a portion of the first chip mounting region, wherein the third chip mounting region does not overlap the second chip mounting region when viewed from a plan view; at least one memory semiconductor chip provided in the first chip mounting region and the second chip mounting region, wherein the at least one memory semiconductor chip includes first conductive bumps and second conductive bumps, wherein the first conductive bumps are electrically connected to the plurality of first through electrodes, wherein the second conductive bumps are provided in the peripheral region and are electrically connected to the plurality of conductive connectors; and at least one dummy chip mounted in the third chip mounting region.

According to an aspect of an example embodiment, a semiconductor package includes: a lower redistribution wiring layer including: a first chip mounting region; and a peripheral region provided at a periphery of the first chip mounting region; a logic semiconductor chip mounted in the first chip mounting region, wherein the logic semiconductor chip includes a plurality of through electrodes that are electrically connected to the lower redistribution wiring layer; a sealing member covering the logic semiconductor chip, wherein the sealing member is provided on the lower redistribution wiring layer; a plurality of conductive connectors penetrating the sealing member in the peripheral region, wherein the plurality of conductive connectors are electrically connected to the lower redistribution wiring layer; an upper redistribution wiring layer provided on the seal, wherein the upper redistribution wiring layer is electrically connected to the plurality of conductive connectors, wherein the upper redistribution wiring layer includes a second chip mounting region overlapping at least a portion of the first chip mounting region when viewed from a plan view; and at least one memory semiconductor chip mounted in the second chip mounting region, wherein the at least one memory semiconductor chip includes first conductive bumps and second conductive bumps, wherein the first conductive bumps are provided in the first chip mounting region and the second chip mounting region, wherein the first conductive bumps are electrically connected to the plurality of through electrodes, and wherein the second conductive bumps are provided in the peripheral region and are electrically connected to the plurality of conductive connectors.

BRIEF DESCRIPTION OF THE DRAWINGS

The above and other aspects and features will be more apparent from the following description of example embodiments taken in conjunction with the accompanying drawings, in which:

FIGS. 5, 6, 7, 8, 9, 10, 11, 12, and 13 are views illustrating a method of manufacturing a semiconductor package in accordance with one or more example embodiments.

DETAILED DESCRIPTION

Figure 1:
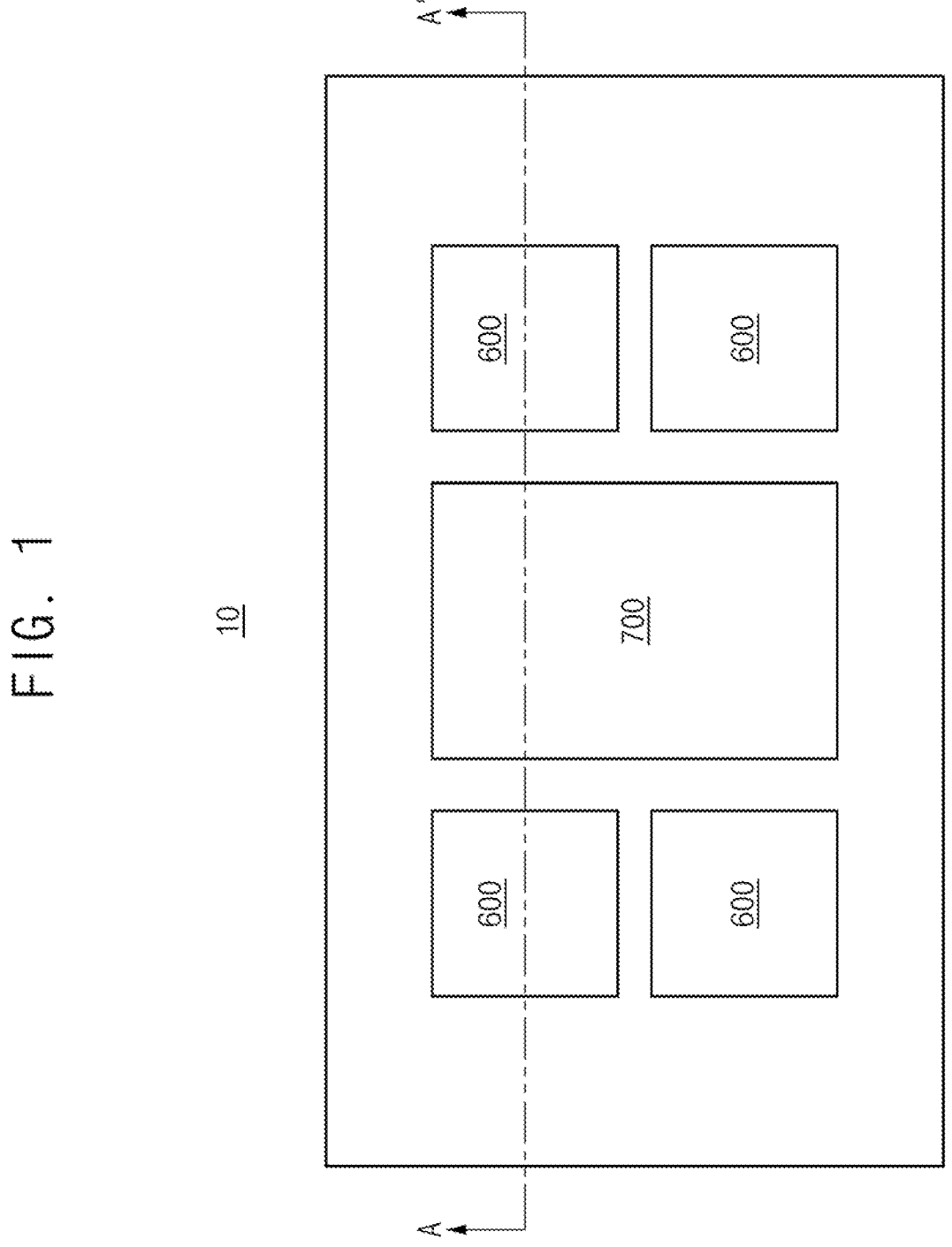
FIG. 1 is a plan view illustrating a semiconductor package in accordance with one or more example embodiments.

Hereinafter, example embodiments will be explained in detail with reference to the accompanying drawings. The same reference numerals are used for the same components in the drawings, and duplicate descriptions thereof are omitted.

According to one or more example embodiments, the memory semiconductor chip may exchange data signals with the logic semiconductor chip through the first conductive bump. The memory semiconductor chip may exchange a power signal or a ground signal with the lower redistribution wiring layer through the second conductive bump and the conductive connector. Because the semiconductor package has a structure capable of electrically connecting the memory semiconductor chip and the logic semiconductor chip without an interposer, a size of the semiconductor package may be reduced and a cost of manufacturing the semiconductor package may be reduced.

Also, because, according to one or more example embodiments, the memory semiconductor chip may be vertically disposed on the logic semiconductor chip and the conductive connectors on the upper redistribution wiring layer, an interconnection distance between the memory semiconductor chip and the logic semiconductor chip may be reduced, and operation latency may be reduced.

Figure 2:
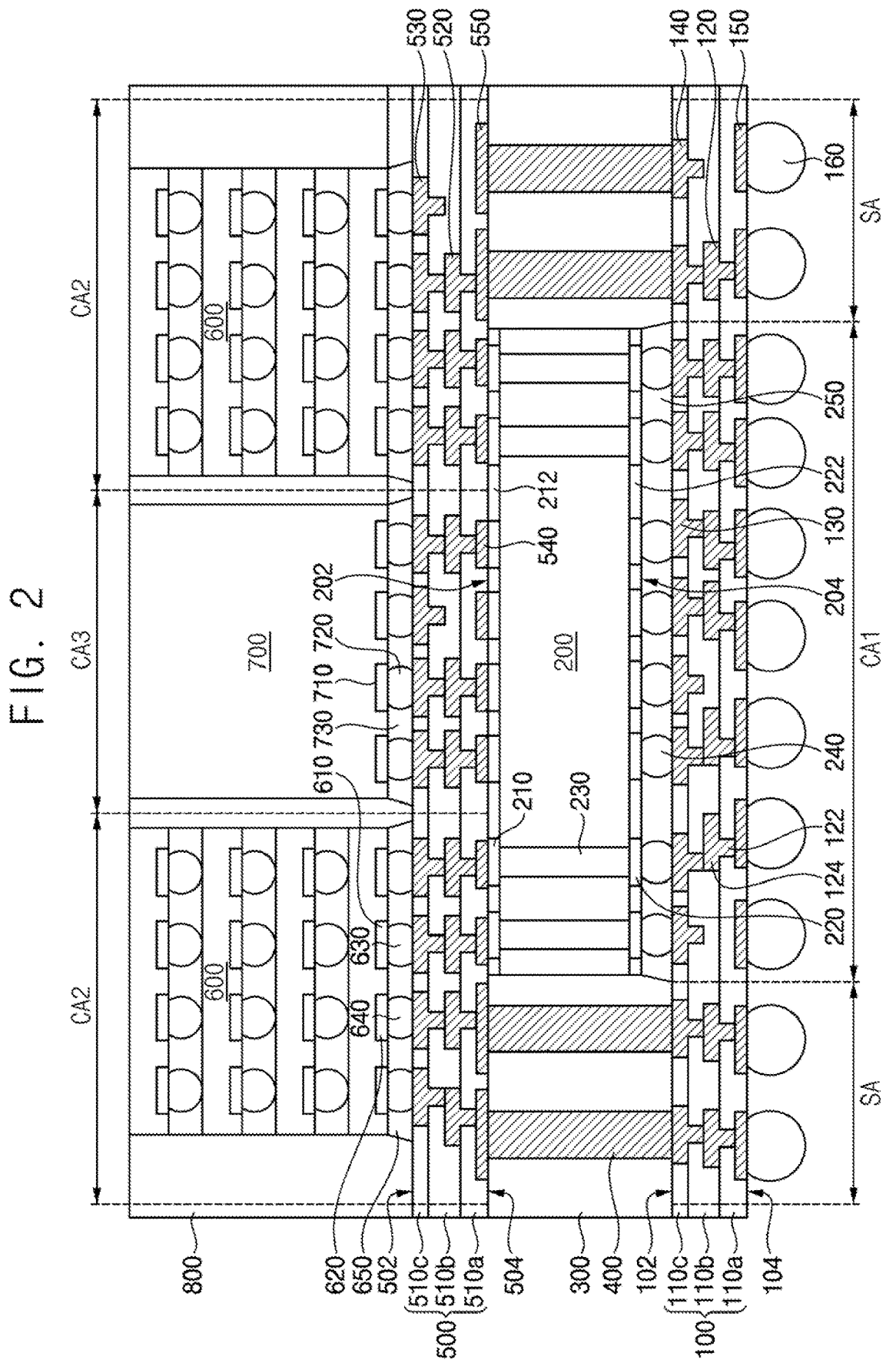
FIG. 2 is a cross-sectional view taken along the line A-A' in FIG. 1, according to one or more example embodiments.
Figure 3:
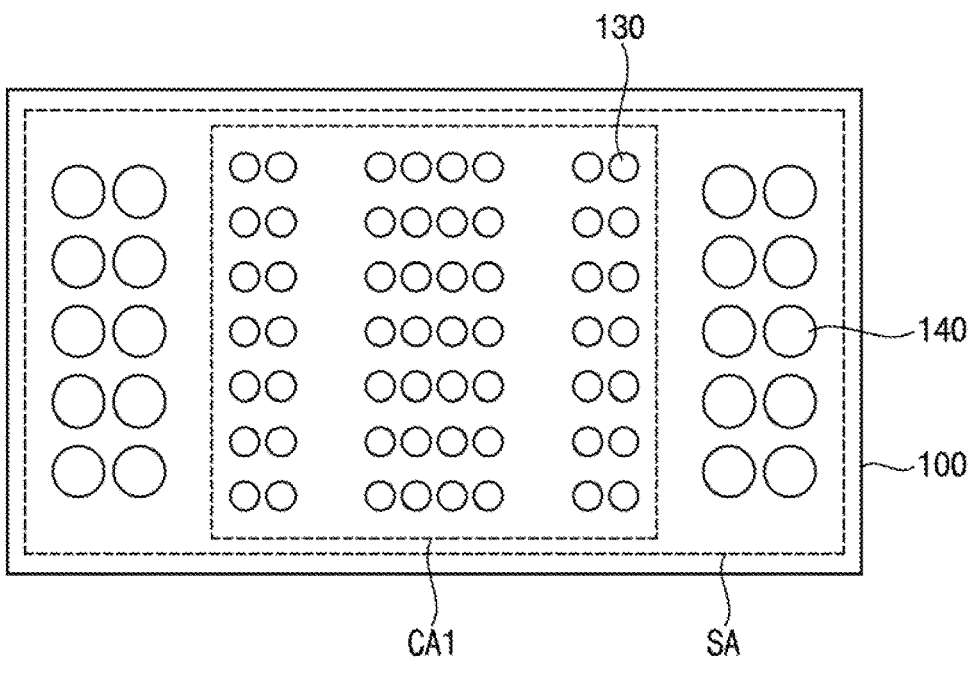
FIG. 3 is a plan view illustrating a chip mounting region and a peripheral region that are exposed from an upper surface of a lower redistribution wiring layer, according to one or more example embodiments.
Figure 4:
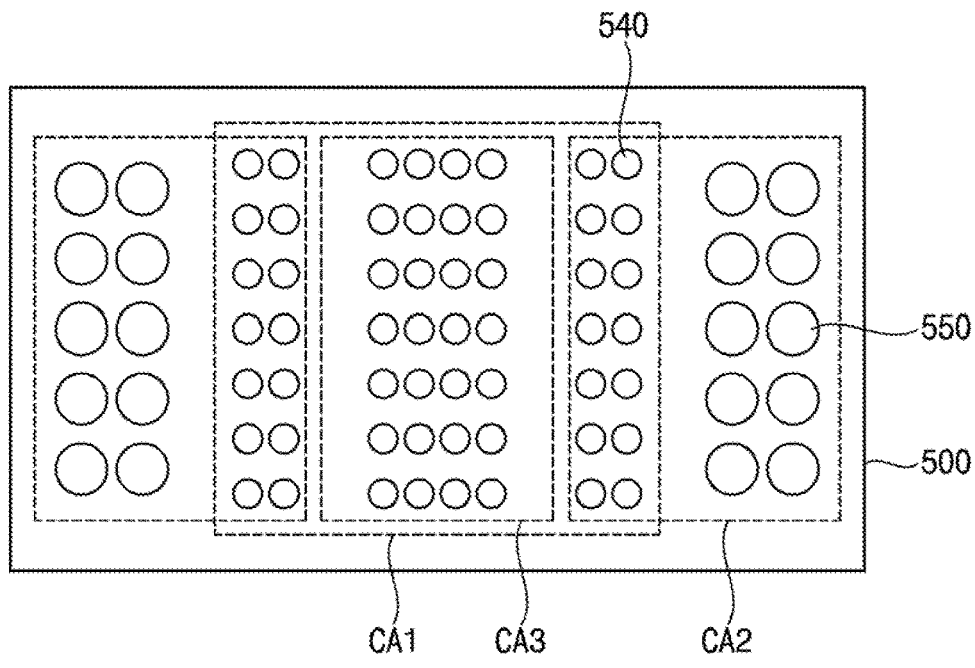
FIG. 4 is a plan view illustrating second and third chip mounting regions that are exposed from a lower surface of an upper redistribution wiring layer, according to one or more example embodiments.

FIG. 1 is a plan view illustrating a semiconductor package in accordance with one or more example embodiments. FIG. 2 is a cross-sectional view taken along the line A-A' in FIG. 1, according to one or more example embodiments. FIG. 3 is a plan view illustrating a chip mounting region and a peripheral region that are exposed from an upper surface of a lower redistribution wiring layer, according to one or more example embodiments. FIG. 4 is a plan view illustrating second and third chip mounting regions that are exposed from a lower surface of an upper redistribution wiring layer, according to one or more example embodiments.

Referring to FIGS. 1, 2, 3, and 4, a semiconductor package 10 may include a lower redistribution wiring layer 100, at least one logic semiconductor chip 200 mounted on the lower redistribution wiring layer 100, a first sealing member 300 covering the logic semiconductor chip 200 on the lower redistribution wiring layer 100, a plurality of conductive connectors 400 penetrating the first sealing member 300 in a vertical direction, an upper redistribution wiring layer 500 disposed on the first sealing member 300, and at least one memory semiconductor chip 600 mounted on the upper redistribution wiring layer 500. The semiconductor package 10 may further include at least one dummy chip 700 mounted on the upper redistribution wiring layer 500. The semiconductor package 10 may further include a second sealing member 800 covering the memory semiconductor chip 600 and the dummy chip 700 on the upper redistribution wiring layer 500.

In one or more example embodiments, the semiconductor package 10 may be referred to a memory module having a stacked chip structure in which a plurality of dies (chips) is stacked. For example, the logic semiconductor chip may include an application-specific integrated circuit (ASIC) serving as a host including, but not limited to, a CPU, GPU, or a system-on-chip (SoC). The memory semiconductor chip 600 may include, but is not limited to, a high bandwidth memory (HBM) device, a dynamic random access memory (DRAM), and/or the like.

In one or more example embodiments, the lower redistribution wiring layer 100 may include a plurality of lower redistribution wirings 120. The lower redistribution wiring layer 100 may include a first upper surface 102 and a first lower surface 104 opposite to the first upper surface 102. The lower redistribution wiring layer 100 may include a plurality of first and second bonding pads 130 and 140 provided to be exposed on the upper surface of the lower redistribution wiring layer 100. That is, the first upper surface 102, and a plurality of first connecting pads 150 provided to be exposed on the lower surface of the lower redistribution wiring layer 100, that is, the first lower surface 104.

The lower redistribution wiring layer 100 may include a first chip mounting region CA1 in which the logic semiconductor chip 200 is mounted and a peripheral region SA surrounding the first chip mounting region CA1. The first bonding pads 130 on which the logic semiconductor chip 200 is mounted may be provided in the first chip mounting region CA1. The second bonding pads 140 through which the conductive connectors 400 extend may be provided on the peripheral region SA.

In one or more example embodiments, the lower redistribution wiring layer 100 may include a plurality of lower insulating layers 110, including a first insulating layer 110*a*, a second insulating layer 110*b*, and a third insulating layer 110*c*, and lower redistribution wirings 120 provided in the lower insulating layers. The lower insulating layers 110 may include, but is not limited to, a polymer or a dielectric layer. The lower insulating layers 110 may be formed by a vapor deposition process, a spin coating process, or the like. The lower redistribution wiring may be formed by a plating process, an electroless plating process, a vapor deposition process, or the like. The lower redistribution wiring may electrically connect the first bonding pads 130, the second bonding pads 140 and third bonding pads 150.

In one or more example embodiments, the lower insulating layers 110 may cover the lower redistribution wirings 120. The first insulating layer 110*a* may be provided on the first lower surface 104 of the lower redistribution wiring layer 100, and the third insulating layer 110*c* (uppermost one of the insulating layers 110) may be provided on the first upper surface 102 of the lower redistribution wiring layer 100.

Particularly, the plurality of first and second bonding pads 130 and 140 may be provided in the third insulating layer 110*c*. Upper surfaces of each of the first and second bonding pads 130 and 140 may be exposed from the upper surface of the third insulating layer 110*c*, that is, the first upper surface 102. The third insulating layer 110*c* may have third openings that expose upper surfaces of each of the first and second bonding pads 130 and 140.

The plurality of first connecting pads 150 may be provided in the first insulating layer 110*a*. A lower surface of one of the first connecting pads 150 may be exposed from a lower surface of the first insulating layer 110*a*, that is, the first lower surface 104. The first insulating layer 110*a* may have a first opening that exposes an upper surface of the first connecting pads 150.

The lower redistribution wirings 120 may be provided in the first insulating layer 110*a* and may contact the first connecting pads 150 through the first opening. The second insulating layer 110*b* may be provided on the first insulating layer 110*a* and may have a second opening that exposes the lower redistribution wirings 120.

The first bonding pads 130 may be provided on the second insulating layer 110*b* and may contact the lower redistribution wirings 120 through the second opening. The third insulating layer 110*c* may be provided on the second insulating layer 110*b* and may have a third opening that exposes the first bonding pads 130. Accordingly, the plurality of first bonding pads 130 may be exposed from the upper surface of the third insulating layer 110*c*, that is, the first upper surface 102.

The lower redistribution wirings 120 may include a redistribution via 124 provided in an opening that penetrates the lower insulating layers 110, and a redistribution line 122 stacked on the redistribution via 124 and extending along an upper surface of the first insulating layer 110*a*. For example, the redistribution via 124 may be provided on the redistribution line 122 and may extend toward the first lower surface 104 of the lower redistribution wiring layer 100. For example, the semiconductor package 10 may include a chip last structure.

The first and second bonding pads 130 and 140, the first connecting pads 150 and the lower redistribution wirings 120 may include a metal material. For example, the metal material may include, but is not limited to, nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In one or more example embodiments, the lower redistribution wiring layer 100 may be electrically connected to other semiconductor devices through external connection bumps 160, which may be configured as conductive connection members. The external connection bumps 160 may be provided on the first connecting pads 150. For example, the external connection bumps 160 may include a C4 bump. The first connecting pads 150 of the lower redistribution wiring layer 100 may be electrically connected to a substrate pad of a package substrate through the external connection bumps 160.

In one or more example embodiments, the logic semiconductor chip 200 may have a first surface 202 and a second surface 204 opposite to the first surface 202. The logic semiconductor chip 200 may include a plurality of first chip pads 210 exposed from the first surface 202, a plurality of second chip pads 220 exposed from the second surface 204, through electrodes 230 connecting the first and second chip pads 210 and 220, and solder bumps 240 respectively provided on the second chip pads 220. The logic semiconductor chip 200 may further include a first protective layer 212 that exposes the first chip pads 210 on the first surface 202, and a second protective layer 222 that exposes the second chip pads 220 on the second surface 204.

In one or more example embodiments, the logic semiconductor chip 200 may be provided on the lower redistribution wiring layer 100. The logic semiconductor chip 200 may be mounted in the first chip mounting region CA1 of the lower redistribution wiring layer 100. The logic semiconductor chip 200 may be mounted on the lower redistribution wiring layer 100 by a flip chip bonding method, for example. In this case, the logic semiconductor chip 200 may be mounted on the lower redistribution wiring layer 100 such that an active surface on which the second chip pads 220 are provided faces the lower redistribution wiring layer 100. The second chip pads 220 of the logic semiconductor chip 200 may be electrically connected to the first bonding pads 130 of the lower redistribution wiring layer 100 through the solder bumps 240, which may be configured as conductive connection members. For example, the solder bumps 240 may include micro bumps (uBumps).

The logic semiconductor chip 200 may include a silicon substrate and an activation layer provided on the silicon substrate. The activation layer may have circuit patterns. The circuit patterns may be provided on one surface of the silicon substrate. The circuit pattern may include active elements and/or passive elements. The circuit pattern may include, but is not limited to, transistors, diodes, resistors, capacitors, inductors, and the like. The circuit pattern may be formed through a wafer process called a front-end-of-line (FEOL) process.

The through electrodes 230 may penetrate through the silicon substrate and may electrically connect the first and second chip pads 210 and 220 to each other. The through electrodes 230 may be electrically connected to at least some of the lower redistribution wirings 120 of the lower redistribution wiring layer 100. The through electrodes 230 may be electrically connected to the circuit patterns. When other semiconductor devices are mounted on the first surface 202 of the memory semiconductor chip 600, the through electrodes 230 may electrically connect the circuit patterns of the memory semiconductor chip 600 and the other semiconductor devices. For example, the through electrodes 230 may be provided along an outer surface of the logic semiconductor chip 200. The through electrodes 230 may be provided along an inner surface of the first chip mounting region CA1.

The first protective layer 212 may be provided on the first surface 202 of the logic semiconductor chip 200, and the second protective layer 222 may be provided on the second surface 204 of the logic semiconductor chip 200. The first and second protective layers 212 and 222 may include an insulating material configured to protect the silicon substrate from an outside. The first and second protective layers 212 and 222 may include, but are not limited to, an oxide film or a nitride film, or may include a double layer of an oxide film and a nitride film. The first and second protective layers 212 and 222 may include silicon oxide ($SiO_2$) through a high-density plasma chemical vapor deposition (HDP-CVD) process.

A first adhesive member 250 may be provided between the logic semiconductor chip 200 and the lower redistribution wiring layer 100. For example, the first adhesive member 250 may include, but is not limited to, an epoxy material.

In one or more example embodiments, the first sealing member 300 may cover the logic semiconductor chip 200 and the conductive connectors 400 on the lower redistribution wiring layer 100. The first sealing member 300 may be provided on the lower redistribution wiring layer 100 to fill a space between the lower redistribution wiring layer 100 and the upper redistribution wiring layer 500.

The first sealing member 300 may include a plurality of through openings through which the conductive connectors 400 are inserted, respectively. One end of one of the conductive connectors 400 within the through opening may be electrically connected to the second bonding pads 140 of the lower redistribution wiring layer 100, and the other end of one of the conductive connectors 400 may be electrically connected to the third connecting pad 550 of the upper redistribution wiring layer 500.

The upper redistribution wiring layer 500 may be provided on the upper surface of the first sealing member 300. The first sealing member 300 may have an upper surface on which the upper redistribution wiring layer 500 may be provided. For example, the first sealing member 300 may include, but is not limited to, an epoxy molding compound (EMC). The first sealing member 300 may include, but is not limited to, a UV resin, a polyurethane resin, a silicone resin, a silica filler or similar materials.

In one or more example embodiments, the conductive connectors 400 may penetrate through the first sealing member 300 in the vertical direction to electrically connect the lower redistribution wiring layer 100 to the upper redistribution wiring layer 500. The conductive connectors 400 may be provided in the through opening of the first sealing member 300. The conductive connectors 400 may extend from the lower redistribution wiring layer 100 in the same vertical direction as a thickness direction of the lower redistribution wiring layer 100.

The conductive connectors 400 may be provided on the lower redistribution wiring layer 100. The conductive connectors 400 may be provided in the peripheral region SA surrounding the first chip mounting region CA1. The conductive connectors 400 may be provided outside the logic semiconductor chip 200 that is mounted on the first chip mounting region CA1.

Particularly, the conductive connectors 400 may be electrically connected to the second bonding pads 140 of the lower redistribution wiring layer 100. The conductive connectors 400 may be electrically connected to the third connecting pad 550 of the upper redistribution wiring layer 500. The conductive connectors 400 may provide a signal movement path that electrically connects the upper redistribution wiring layer 500 and the lower redistribution wiring layer 100.

For example, the conductive connectors 400 may include, but are not limited to, a pillar shape or a bump shape. The conductive connectors 400 may include, but are not limited to, nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn). The conductive connectors 400 may be formed by a plating process, an electroless plating process, a vapor deposition process, or similar processes.

In one or more example embodiments, the upper redistribution wiring layer 500 may have a second upper surface 502 and a second lower surface 504 opposite to the second upper surface 502. The upper redistribution wiring layer 500 may include a plurality of third bonding pads 530 that are exposed from the second upper surface 502, and a plurality of second and third connecting pads 540 that are exposed from the second lower surface 504. The upper redistribution wiring layer 500 may be provided on the upper surface of the first sealing member 300. At least one memory semiconductor chip 600 may be provided on the upper redistribution wiring layer 500. At least one dummy chip 700 may be provided on the upper redistribution wiring layer 500.

The upper redistribution wiring layer 500 may include a second chip mounting region CA2 in which at least one memory semiconductor chip 600 is mounted, and a third chip mounting region CA3 in which the dummy chip 700 is mounted. According to one or more example embodiments, the second chip mounting region CA2 and the third chip mounting region CA3 may not overlap each other on the upper redistribution wiring layer 500. The third bonding pads 530 on which the memory semiconductor chip 600 may be mounted may be provided in the second chip mounting region CA2. At least a portion of the second chip mounting region CA2 may overlap with at least a portion of the first chip mounting region CA1 of the lower redistribution wiring layer 100 when viewed from a plan view.

The upper redistribution wiring layer 500 may be electrically connected to the lower redistribution wiring layer 100 through the conductive connectors 400 that are electrically connected to the third connecting pads 550. The conductive connectors 400 penetrating the first sealing member 300 may electrically connect the upper redistribution wiring layer 500 and the lower redistribution wiring layer 100.

In one or more example embodiments, the upper redistribution wiring layer 500 may include a plurality of upper insulating layers 510a, 510b, and 510c and upper redistribution wirings 520 provided in the upper insulating layers. The third bonding pads 530, the second connecting pads 540, and the third connecting pads 550 may be electrically connected through the upper redistribution wirings 520.

Particularly, the plurality of third bonding pads 530 may be provided in the sixth insulating layer 510c (an uppermost one of the insulating layers 510a, 510b, and 510c). An upper surface of the third bonding pads 530 may be exposed from an upper surface of the sixth insulating layer 510c, that is, the second upper surface 502. The sixth insulating layer 510c may have a sixth opening that exposes an upper surface of the third bonding pads 530.

The plurality of second and third connecting pads 540 and 550 may be provided in the fourth insulating layer 510a. Lower surfaces of each of the second and third connecting pads 540 and 550 may be exposed from the lower surface of the fourth insulating layer 510a, that is, the second lower surface 504. The fourth insulating layer 510a may have fourth openings that expose upper surfaces of each of the second and third connecting pads 540 and 550.

The second connecting pads 540 may be provided in the first chip mounting region CA1 of the upper redistribution wiring layer 500. At least some of the second connecting pads 540 may be provided in an area where the first and second chip mounting regions CA1 and CA2 overlap each other when viewed from the plan view. The through electrodes 230 of the logic semiconductor chip 200 may be provided in the area where the first and second chip mounting regions CA1 and CA2 overlap each other.

The third connecting pads 550 may be provided in the second chip mounting region CA2 of the upper redistribution wiring layer 500. The third connecting pads 550 may be provided in an area where the second chip mounting region CA2 and the peripheral region SA of the lower redistribution wiring layer 100 overlap each other when viewed from the plan view. The conductive connectors 400 may be provided in the area where the second chip mounting region CA2 and the peripheral region SA overlap each other.

The upper redistribution wirings 520 may be provided on the fourth insulating layer 510a and may contact the second and third connecting pads 540 and 550 through the fourth opening. The fifth insulating layer 510b may be provided on the fourth insulating layer 510a and may have a fifth opening that exposes the upper redistribution wirings 520.

The third bonding pads 530 may be provided on the fifth insulating layer 510b and may contact the upper redistribution wirings 520 through the fifth opening. The sixth insulating layer 510c may be provided on the fifth insulating layer 510b and may have the sixth opening that exposes the third bonding pads 530. Accordingly, the plurality of third bonding pads 530 may be exposed from the upper surface of the sixth insulating layer 510c, that is, the second upper surface 502.

In one or more example embodiments, the memory semiconductor chip 600 may be provided on the upper redistribution wiring layer 500. The memory semiconductor chip 600 may be mounted on the second chip mounting region CA2 of the upper redistribution wiring layer 500. The memory semiconductor chip 600 may be provided on the upper redistribution wiring layer 500 by a flip chip bonding method. In this case, the memory semiconductor chip 600 may be provided on the upper redistribution wiring layer 500 such that an active surface on which third and fourth chip pads 610 and 620 are formed on faces the upper redistribution wiring layer 500.

The third and fourth chip pads 610 and 620 of the memory semiconductor chip 600 may be electrically connected to the third bonding pads 530 of the upper redistribution wiring layer 500 via first and second conductive bumps 630 and 640, which may be configured as conductive connection members. For example, the first and second conductive bumps 630 and 640 may include micro bumps (uBumps).

The third chip pads 610 of the memory semiconductor chip 600 may be provided in the area where the first and second chip mounting areas CA1 and CA2 overlap each other when viewed from the plan view. A first one of the conductive bumps 630 may be provided on the third chip pads 610. The third chip pads 610 may be electrically connected to the third bonding pads 530 of the upper redistribution wiring layer 500 through the first conductive bumps 630. The first conductive bumps 630 may be electrically connected to the through electrodes 230 and may be configured to transmit a data signal between the memory semiconductor chip 600 and the logic semiconductor chip 200.

The third chip pads 610 may have a region overlapping with the through electrodes 230 of the logic semiconductor chip 200 when viewed from the plan view. Because the third chip pads 610 are provided on the through electrodes 230, a distance between the logic semiconductor chip 200 and the memory semiconductor chip 600 may be reduced.

The fourth chip pads 620 of the memory semiconductor chip 600 may be provided in the area where the second chip mounting region CA2 and the peripheral region SA of the lower redistribution wiring layer 100 are overlapped each other when viewed from the plan view. The second conductive bumps 640 may be provided on the fourth chip pads 620. The fourth chip pads 620 may be electrically connected to the third bonding pads 530 of the upper redistribution wiring layer 500 through the second conductive bumps 640. The second conductive bumps 640 may be electrically connected to the conductive connectors 400 and may be configured to transmit a power signal or a ground signal between the memory semiconductor chip 600 and the lower redistribution wiring layer 100. The second conductive bumps 640 may be connected in series with the conductive connectors 400. The fourth chip pads 620 may have an area that overlaps with the conductive connectors 400 when viewed from the plan view.

For example, the memory semiconductor chip 600 may include a semiconductor device including, but not limited to, a memory device. The memory semiconductor chip 600 may include volatile memory devices including, but not limited to, SRAM devices and DRAM devices, and nonvolatile memory devices including, but not limited to, flash memory devices, PRAM devices, MRAM devices, RRAM devices, etc.

A second adhesive member 650 may be provided between the memory semiconductor chip 600 and the upper redistribution wiring layer 500. For example, the second adhesive member 650 may include, but is not limited to, an epoxy material.

In one or more example embodiments, the dummy chip 700 may be provided on the upper redistribution wiring layer 500. The dummy chip 700 may be mounted in the third chip mounting region CA3 of the upper redistribution wiring layer 500. The dummy chip 700 may be mounted on the upper redistribution wiring layer 500 by a flip chip bonding method, for example. In one or more example embodiments, the dummy chip 700 may be mounted on the upper redistribution wiring layer 500 such that a lower surface, on which fifth chip pads 710 are formed, faces the upper redistribution wiring layer 500.

The dummy chip 700 may be provided between the memory semiconductor chips 600 and may be configured to absorb heat that is emitted from the memory semiconductor chips 600, and may release the heat to the outside of the semiconductor package 10. The dummy chip 700 may absorb the heat that is emitted from the upper redistribution wiring layer 500, and may release the heat to the outside of the semiconductor package 10.

Alternatively, the dummy chip 700 may have similar memory elements to the memory semiconductor chips 600. For example, the dummy chip 700 may include the volatile memory device and the nonvolatile memory device.

The fifth chip pads 710 of the dummy chip 700 may be bonded to the third bonding pads 530 of the upper redistribution wiring layer 500 through the third conductive bumps 720, which may be configured as conductive connection members. For example, the third conductive bumps 720 may include micro bumps (uBumps).

A third adhesive member 730 may be provided between the dummy chip 700 and the upper redistribution wiring layer 500. For example, the third adhesive member 730 may include, but is not limited to, an epoxy material.

In one or more example embodiments, the second sealing member 800 may cover the memory semiconductor chip 600 and the dummy chip 700 on the upper redistribution wiring layer 500.

The second sealing member 800 may expose upper surfaces of each of the memory semiconductor chip 600 and the dummy chip 700. For example, the second sealing member 800 may include, but is not limited to, an epoxy molding compound (EMC). The second sealing member 800 may include, but is not limited to, a UV resin, a polyurethane resin, a silicone resin, or a silica filler.

As described above, the memory semiconductor chip 600 may exchange data signals with the logic semiconductor chip 200 through the first conductive bumps 630. The memory semiconductor chip 600 may exchange the power signal or the ground signal with the lower redistribution wiring layer 100 through the second conductive bumps 640 and the conductive connectors 400. Among other advantages, because the semiconductor package 10 has a structure capable of electrically connecting the memory semiconductor chip 600 and the logic semiconductor chip 200 without an interposer, a size of the semiconductor package may be reduced and the cost of manufacturing the semiconductor package 10 may be reduced.

Also, because the memory semiconductor chip 600 may be vertically provided on the logic semiconductor chip 200 and the conductive connectors 400 on the upper redistribution wiring layer 500, an interconnection distance between the memory semiconductor chip 600 and the logic semiconductor chip 200 may be reduced, and operation latency may be reduced.

Hereinafter, a method of manufacturing the semiconductor package in FIG. 1 will be described according to one or more example embodiments.

Figure 5:
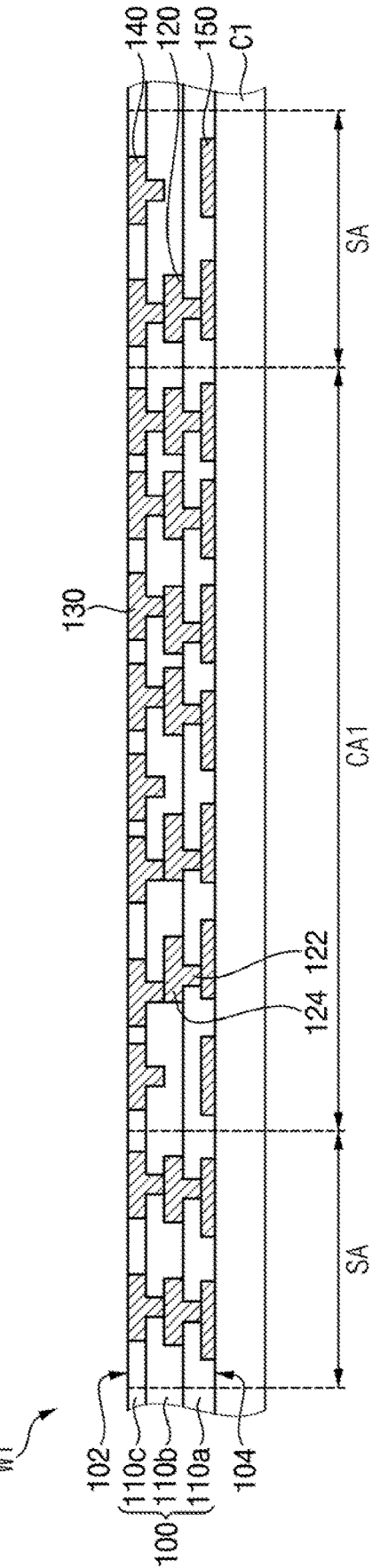
Figure 6:
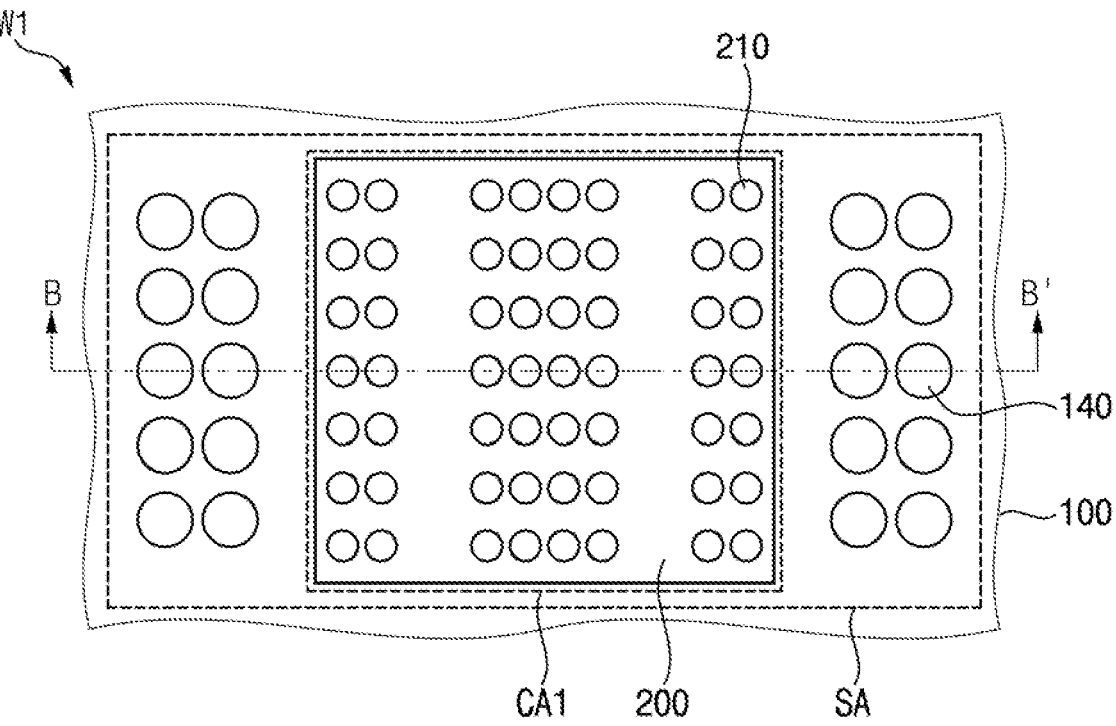
Figure 7:
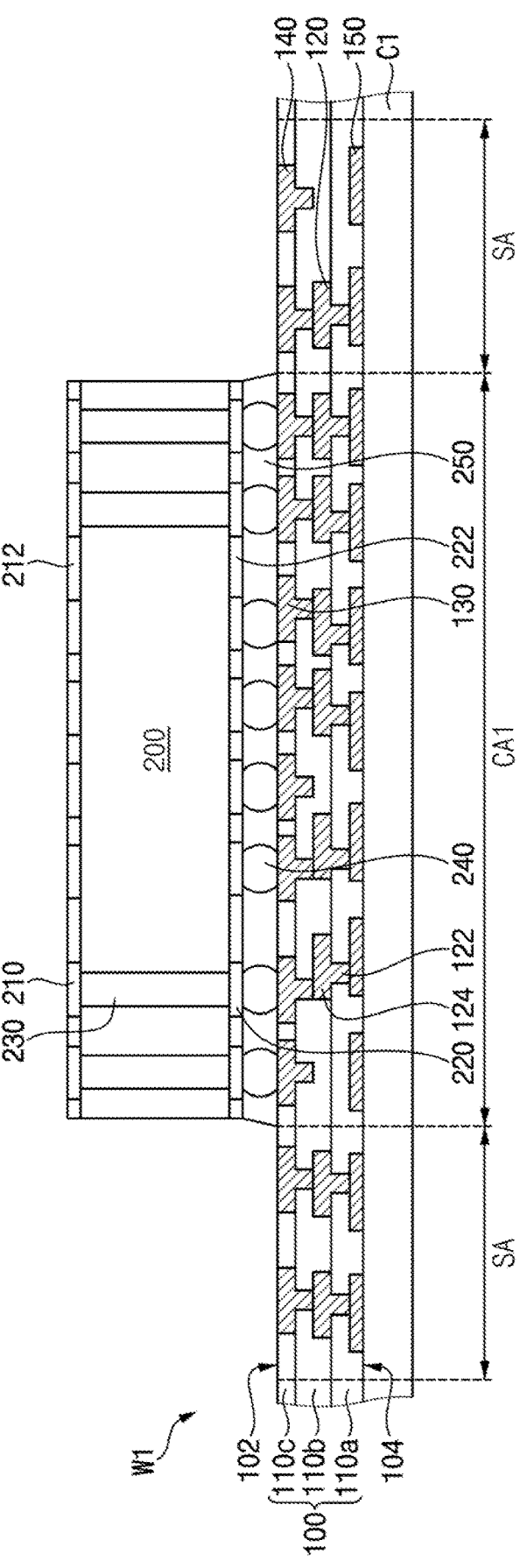
Figure 9:
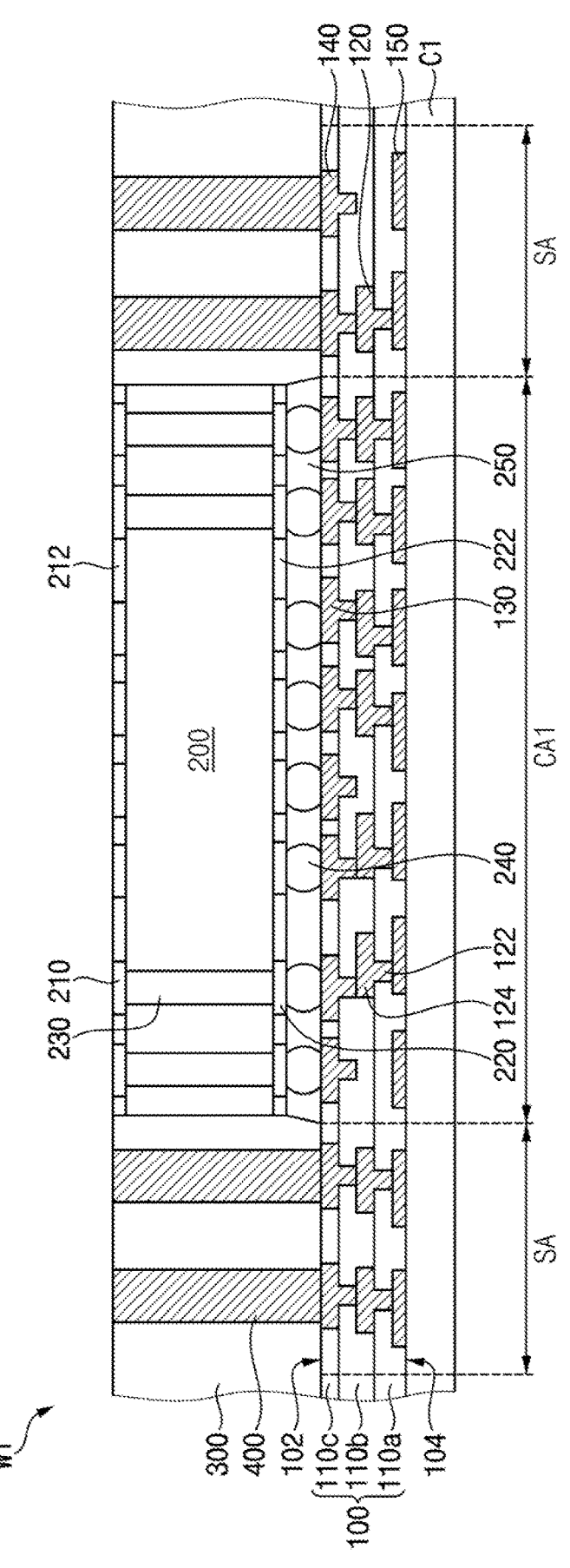
Figure 10:
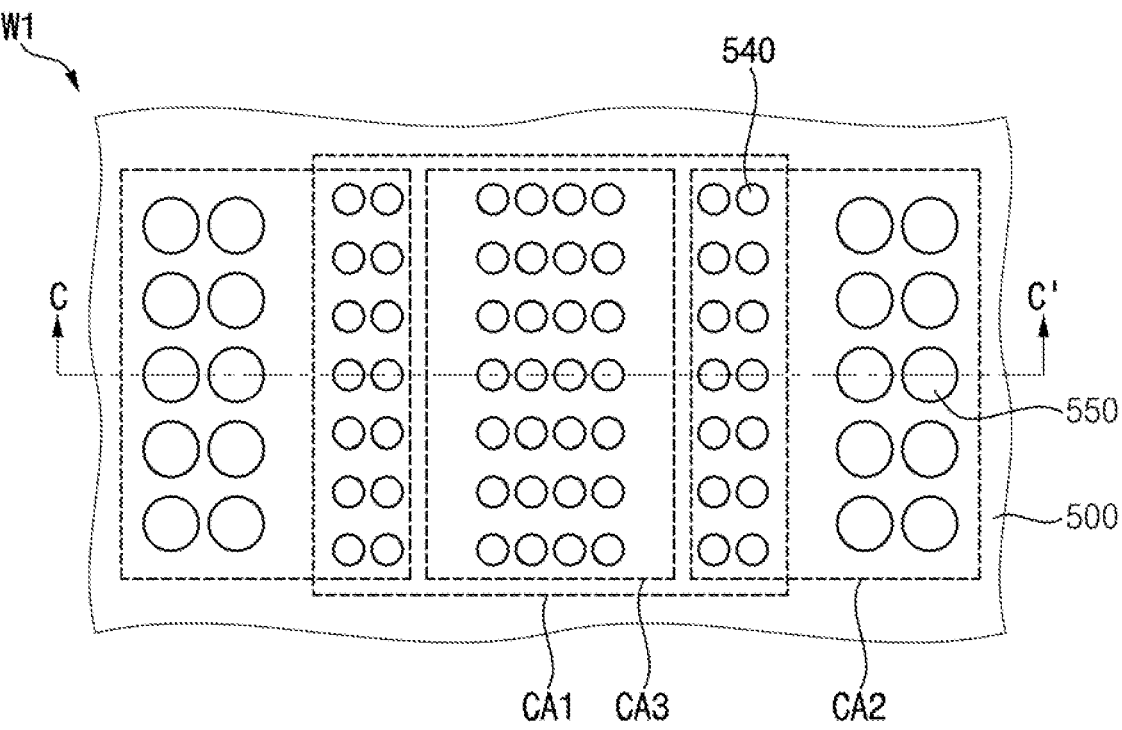
Figure 11:
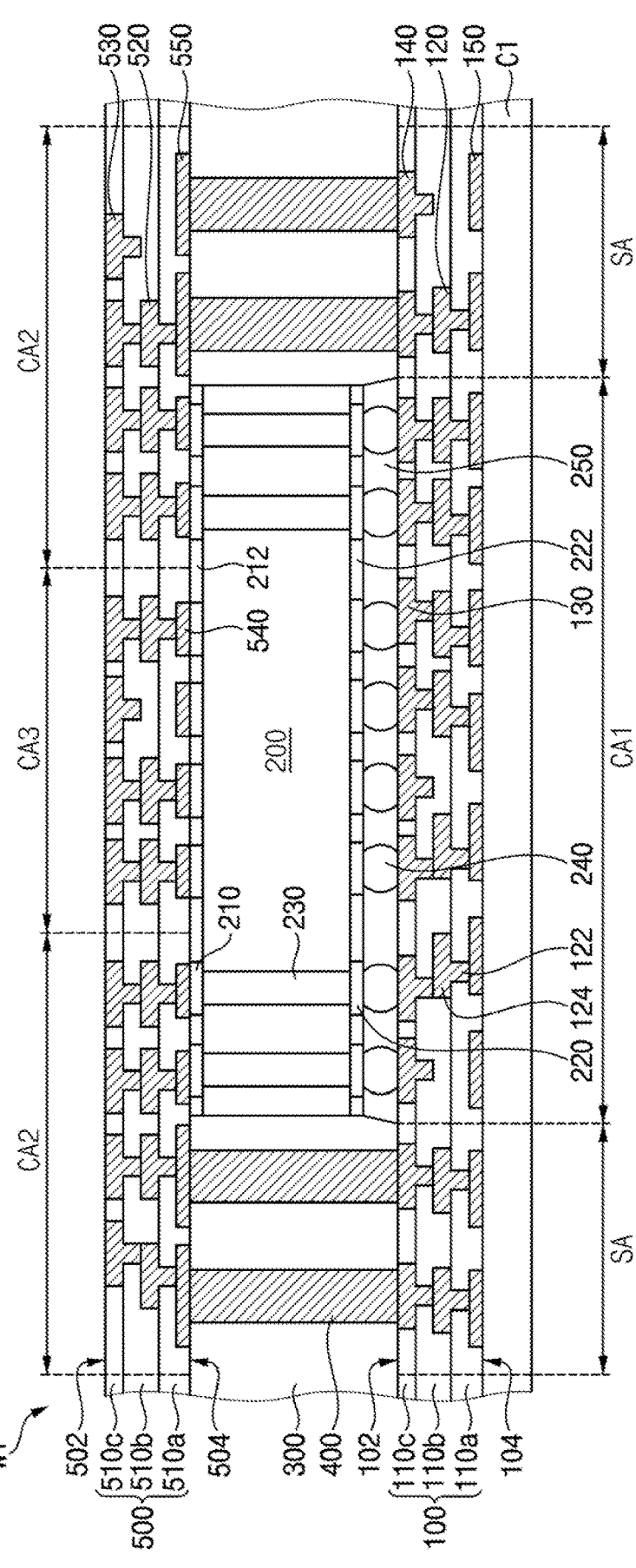
Figure 12:
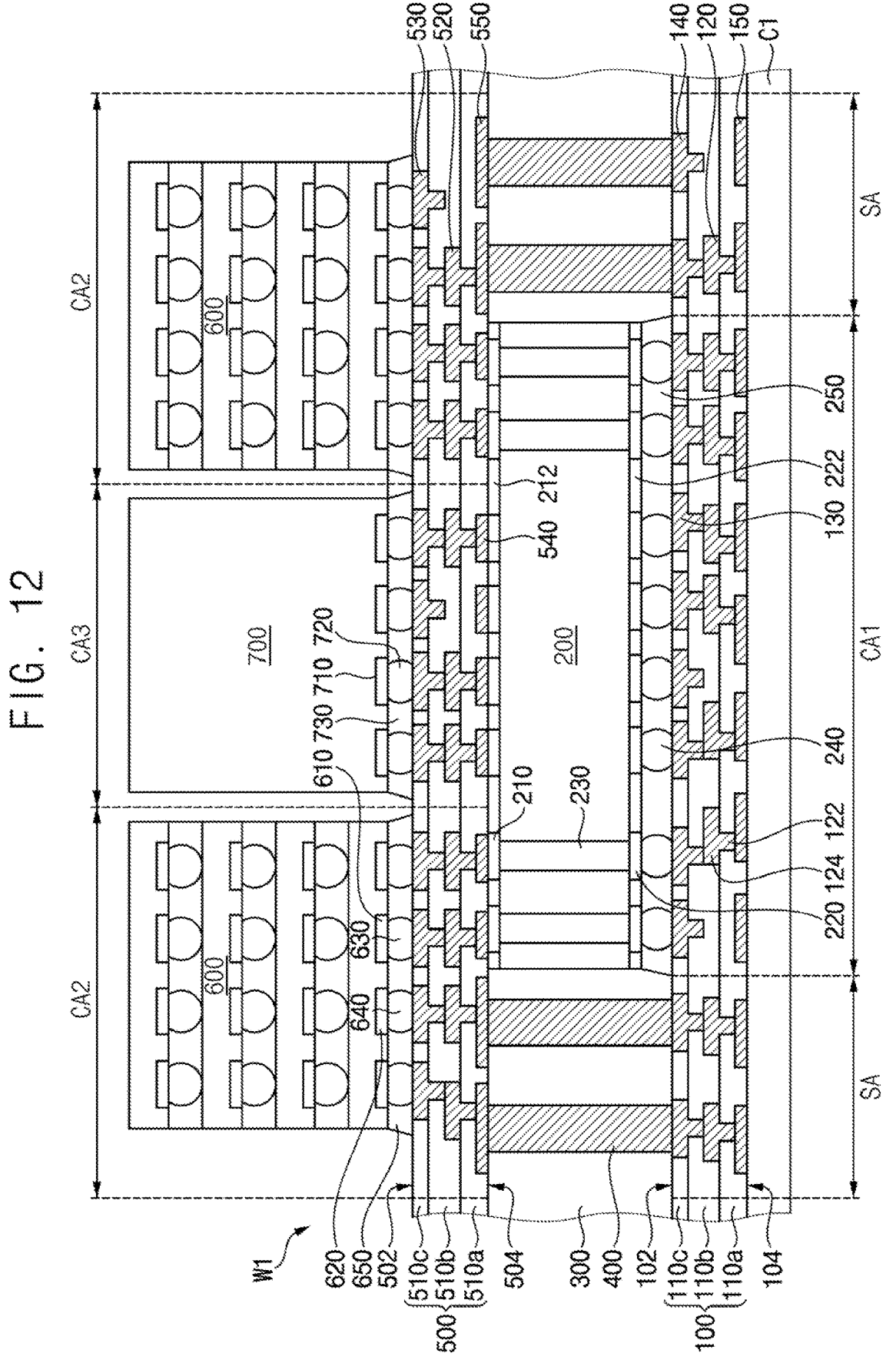

FIGS. 5, 6, 7, 8, 9, 10, 11, 12, and 13 are views illustrating a method of manufacturing a semiconductor package in accordance with one or more example embodiments. FIG. 6 is a plan view illustrating a lower redistribution wiring layer in which logic semiconductor chips are provided, according to one or more example embodiments. FIG. 7 is a cross-sectional view taken along the line B-B' in FIG. 6, according to one or more example embodiments. FIG. 11 is a plan view illustrating an upper redistribution wiring layer, according to one or more example embodiments. FIG. 12 is a cross-sectional view taken along the line C-C' in FIG. 11, according to one or more example embodiments.

Referring to FIG. 5, a semiconductor wafer W1 having a lower redistribution wiring layer 100 may be provided on a carrier substrate C1. The lower redistribution wiring layer 100 may include a first chip mounting region CA1 in which the logic semiconductor chip 200 is provided, and a peripheral region SA around the first chip mounting region CA1.

First, first connecting pads 150 may be formed on the carrier substrate C1, and a first insulating layer 110*a* may be formed on the first connecting pads 150. Then, the first insulating layer 110*a* may be patterned to form first openings that expose the first connecting pads 150.

For example, the first insulating layer 110*a* may include, but is not limited to, a polymer or a dielectric layer. Particularly, the first insulating layer 110*a* may include, but is not limited to, polyimide (PI), lead oxide (PbO), polyhydroxystyrene (PHS), novolac, or similar materials. The first insulating layer 110*a* may be formed by a vapor deposition process, a spin coating process, or similar processes.

Lower redistribution wirings 120 may be formed on the first insulating layer 110*a* to directly contact each of the first connecting pads 150 through the first openings.

After a seed film is formed in a portion of the first insulating layer 110*a* and in the first opening, the seed layer may be patterned and an electroplating process may be performed to form the lower redistribution wirings 120. Accordingly, at least a portion of the lower redistribution wirings 120 may directly contact each of the first connecting pads 150 through the first opening.

For example, the lower redistribution wirings 120 may include, but is not limited to, aluminum (Al), copper (Cu), tin (Sn), nickel (Ni), gold (Au), platinum (Pt), or an alloy thereof.

Then, after a second insulating layer 110*b* is formed on the first insulating layer 110*a* to cover the lower redistribution wirings 120, the second insulating layer 110*b* may be patterned to form a second opening that exposes the lower redistribution wirings 120. First and second bonding pads 130 and 140 may be formed on the second insulating layer 110*b* to directly contact the first redistribution wiring 120*a* through the second openings. The first bonding pads 130 may be formed in the first chip mounting region CA1, and the second bonding pads 140 may be formed in the peripheral region SA.

Then, after a third insulating layer 110*c* is formed to cover each of the first and second bonding pads 130 and 140, the third insulating layer 110*c* being formed on the second insulating layer 110*b*, the third insulating layer 110*c* may be patterned to form third openings that expose the first and second bonding pads 130 and 140.

Figure 8:
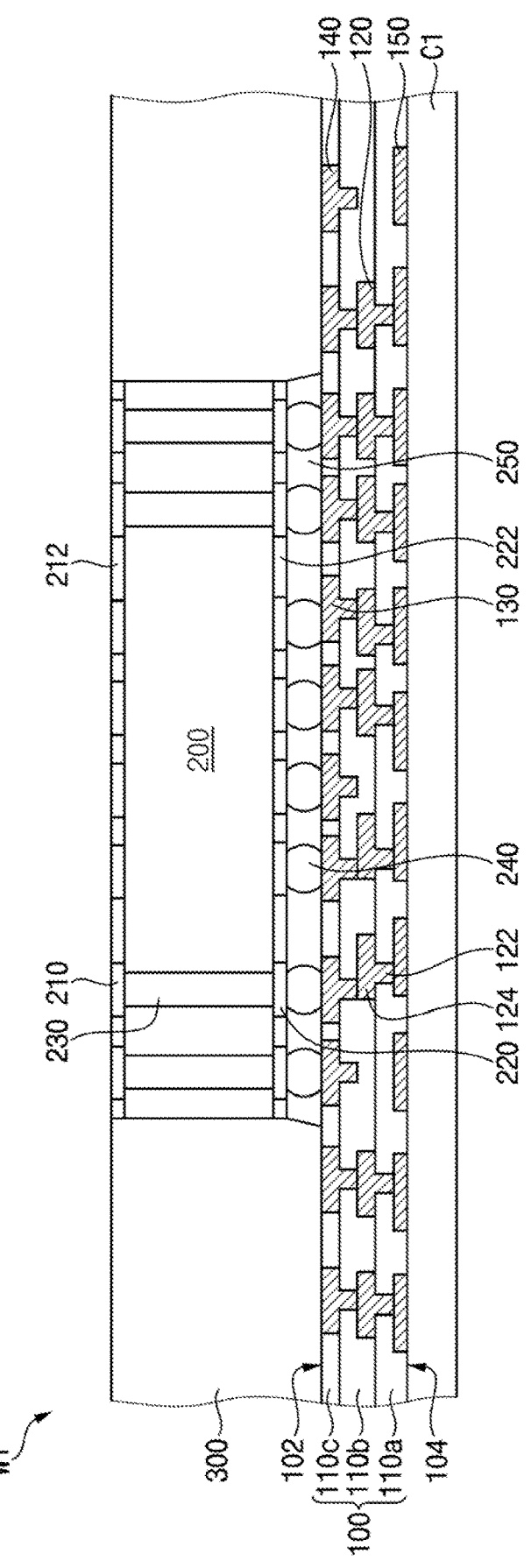

Referring to FIGS. 6, 7 and 8, after the logic semiconductor chip 200 is provided on the lower redistribution wiring layer 100 of the semiconductor wafer W1, a first sealing member 300 may be formed on the lower redistribution wiring layer 100 to cover the logic semiconductor chip 200.

In one or more example embodiments, the logic semiconductor chip 200 may be provided on the lower redistribution wiring layer 100 by a flip chip bonding method. The logic semiconductor chip 200 may be provided in the first chip mounting region CA1 of the lower redistribution wiring layer 100. Second chip pads 220 of the logic semiconductor chip 200 may be electrically connected to the first bonding pads 130 of the lower redistribution wiring layer 100 through solder bumps 240. For example, the solder bumps 240 may include micro bumps (uBumps).

Then, a first adhesive member 250 may be filled between the lower redistribution wiring layer 100 and the logic semiconductor chip 200. For example, the first adhesive member 250 may include, but is not limited to, an epoxy material to reinforce a gap between the lower redistribution wiring layer 100 and the logic semiconductor chip 200.

For example, the first sealing member 300 may include, but is not limited to, an epoxy molding compound (EMC). The first sealing member 300 may include, but is not limited to, a UV resin, a polyurethane resin, a silicone resin, or a silica filler.

Referring to FIG. 9, according to one or more example embodiments, a plurality of conductive connectors 400 may be formed on the lower redistribution wiring layer 100 and the plurality of conductive connectors 400 may penetrate the first sealing member 300 in a vertical direction.

First, an upper surface of the first sealing member 300 may be covered through a first photoresist film. Then, the exposure process may be performed on the first photoresist film to form through openings that expose the second bonding pads 140.

Then conductive connectors 400 may be formed in the through openings that penetrate the first photoresist film in the vertical direction. A first plating process may be performed in the through openings to form the conductive connectors 400. For example, the conductive connectors 400 may be formed by a plating process, an electroless plating process, a vapor deposition process, or similar processes. The conductive connectors 400 may have a pillar shape or a bump shape.

Then, the first photoresist film may be removed to form conductive connectors 400 that respectively extend from the second bonding pads 140. Alternatively, after the conductive connectors 400 are formed on the second bonding pads 140 of the lower redistribution wiring layer 100, the first sealing member 300 may be formed on the lower redistribution wiring layer 100 to cover the previously formed conductive connectors 400. The conductive connectors 400 may be formed on the peripheral region SA of the lower redistribution wiring layer 100.

The upper surface of the first sealing member 300 may be partially removed by a grinding process including, but not limited to, a chemical mechanical polishing (CMP) process. Accordingly, a thickness of the first sealing member 300 may be reduced to a desired thickness. One end of the conductive connectors 400 may be exposed from the upper surface of the first sealing member 300. An upper surface of the logic semiconductor chip 200 may be exposed from the upper surface of the first sealing member 300.

Referring to FIGS. 10 and 11, according to one or more example embodiments, processes the same as or similar to the processes described with reference to FIG. 5 may be performed to form an upper redistribution wiring layer 500 on the semiconductor wafer W1.

Initially, second and third connecting pads 540 and 550 may be formed on the first sealing member 300. The second connecting pads 540 may be formed on upper surfaces of the conductive connectors 400, respectively. The third connecting pads 550 may be respectively formed on first chip pads 210 that are exposed from the upper surface of the logic semiconductor chip 200.

Then, after a fourth insulating layer 510*a* is formed to cover the second and third connecting pads 540 and 550 on the upper surfaces of the first sealing member 300 and the logic semiconductor chip 200, the fourth insulating layer 510*a* may be patterned to form fourth openings that expose the second and third connecting pads 540 and 550. The fourth insulating layer 510*a* may be formed to contact the upper surface of the logic semiconductor chip 200. The second connecting pads 540 may be formed in the first chip mounting region CA1, and the third connecting pads 550 may be formed in the peripheral region SA.

An upper redistribution wirings 520 may be formed on the fourth insulating layer 510*a* to directly contact the second and third connecting pads 540 and 550 through the fourth openings. After a seed film is formed on a portion of the fourth insulating layer 510*a*, and in the fourth opening, the seed film may be patterned and an electroplating process may be performed to form the upper redistribution wirings 520. Accordingly, at least a portion of the upper redistribution wirings 520 may directly contact the second and third connecting pads 540 and 550 through the fourth openings.

Then, after a fifth insulating layer 510*b* is formed on the fourth insulating layer 510*a* to cover the upper redistribution wirings 520, the fifth insulating layer 510*b* may be patterned to form fifth openings that expose the upper redistribution wirings 520. Third bonding pads 530 directly contacting the upper redistribution wirings 520 may be formed on the fifth insulating layer 510*b* through the fifth openings.

Then, after a sixth insulating layer 510*c* is formed on the fifth insulating layer 510*b* to cover the third bonding pads 530, the sixth insulating layer 510*c* may be patterned to form sixth openings that expose the third bonding pads 530.

Referring to FIG. 12, according to one or more example embodiments, processes the same as or similar to the processes described with reference to FIG. 7 may be performed to arrange a memory semiconductor chip 600 and a dummy chip 700 on the upper redistribution wiring layer 500 of the semiconductor wafer W1.

In one or more example embodiments, the memory semiconductor chip 600 may be provided on the upper redistribution wiring layer 500 by a flip chip bonding method. The memory semiconductor chip 600 may be provided in the second chip mounting region CA2 of the upper redistribution wiring layer 500. The memory semiconductor chip 600 may be provided on the upper redistribution wiring layer 500 such that third chip pads 610 are positioned in an area where the first and second chip mounting regions CA1 and CA2 overlap. The memory semiconductor chip 600 may be provided on the upper redistribution wiring layer 500 such that fourth chip pads 620 are positioned in an area where the second chip mounting region CA2 and the peripheral region SA overlap.

The third chip pads 610 of the memory semiconductor chip 600 may be electrically connected to the third bonding pads 530 of the upper redistribution wiring layer 500 through the first conductive bumps 630. The fourth chip pads 620 of the memory semiconductor chip 600 may be electrically connected to the third bonding pads 530 of the upper redistribution wiring layer 500 through the second conductive bumps 640. For example, the first conductive bumps 630 and the second conductive bumps 640 may include micro bumps (uBumps).

In one or more example embodiments, the dummy chip 700 may be provided on the upper redistribution wiring layer 500 by flip chip bonding. The dummy chip 700 may be provided in the third chip mounting region CA3 of the upper redistribution wiring layer 500. Fifth chip pads 710 of the dummy chip 700 may be electrically connected to the third bonding pads 530 of the upper redistribution wiring layer 500 through third conductive bumps 720. For example, the third conductive bumps 720 may include micro bumps (uBumps).

Then, a second adhesive member 650 may be filled between the upper redistribution wiring layer 500 and the memory semiconductor chip 600. A third adhesive member 730 may be filled between the upper redistribution wiring layer 500 and the dummy chip 700. For example, the second and third adhesive members 650 and 730 may include, but are not limited to, an epoxy material to reinforce respective gaps between the upper redistribution wiring layer 500, the memory semiconductor chip 600, and the dummy chip 700.

Figure 13:
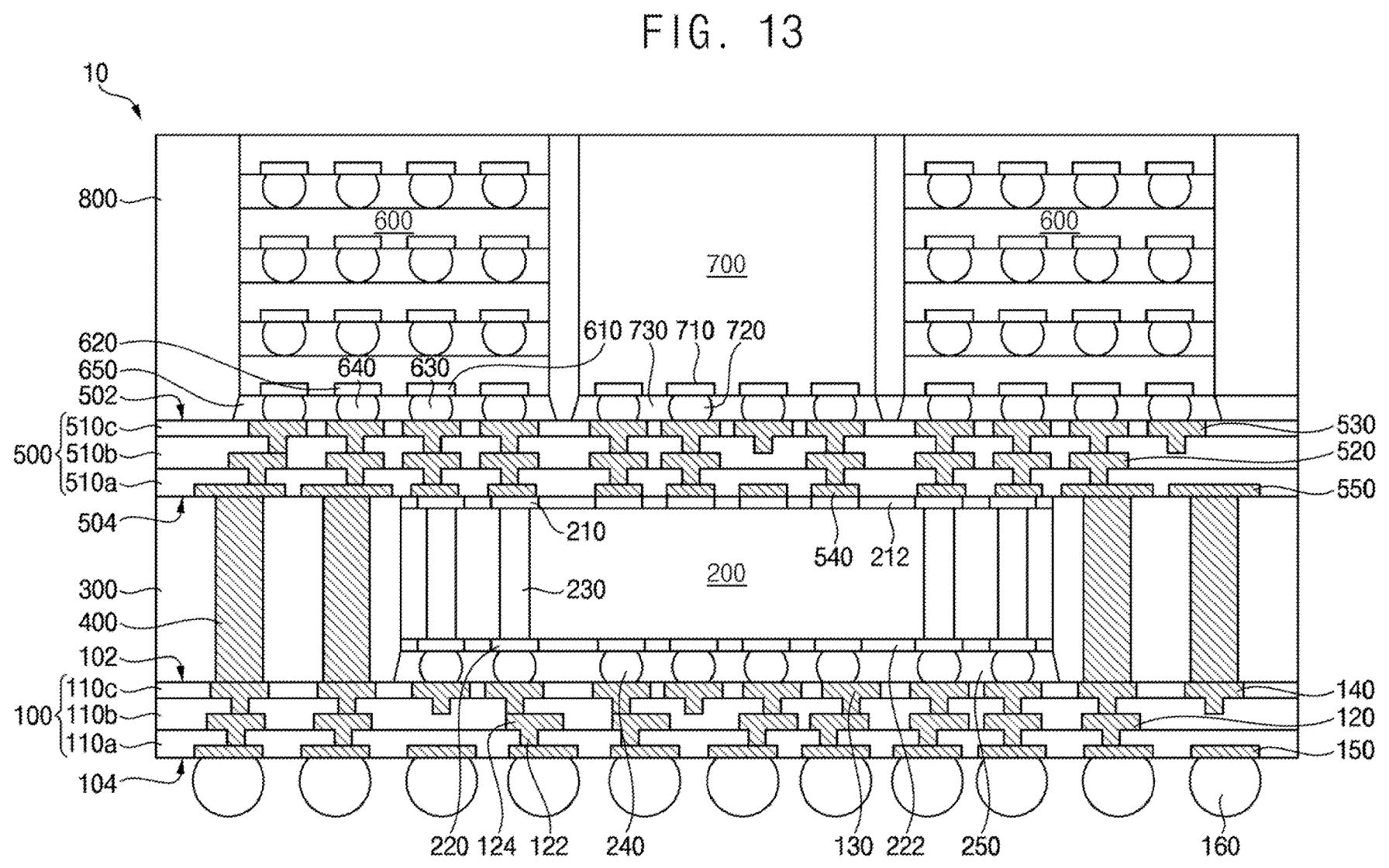

Referring to FIG. 13, according to one or more example embodiments, external connection bumps 160 may be formed on the first connecting pads 150 of the lower redistribution wiring layer 100, a second sealing member 800 may be formed on the upper redistribution wiring layer 500 to cover the memory semiconductor chip 600 and the dummy chip 700, and the semiconductor wafer W1 may be cut to form the semiconductor package 10.

The external connection bumps 160 may be formed on the first connecting pads 150. Particularly, after third temporary opening of third photoresist pattern is filled up with a conductive material, the third photoresist pattern may be removed and a reflow process may be performed to form the external connection bumps 160. For example, the conductive material may be formed by a plating process. Alternatively, the external connection bumps 160 may be formed by a screen printing method, a deposition method, or the like. For example, the external connection bumps 160 may include a C4 bump.

For example, the second sealing member 800 may include an epoxy molding compound (EMC). The second sealing member 800 may include UV resin, polyurethane resin, silicone resin, or silica filler.

Then, the semiconductor wafer W1 may be cut to complete the semiconductor package in FIG. 1. The semiconductor wafer W1 may be cut along a scribe lane region. The semiconductor wafer W1 may be cut through a dicing process.

Figure 14:
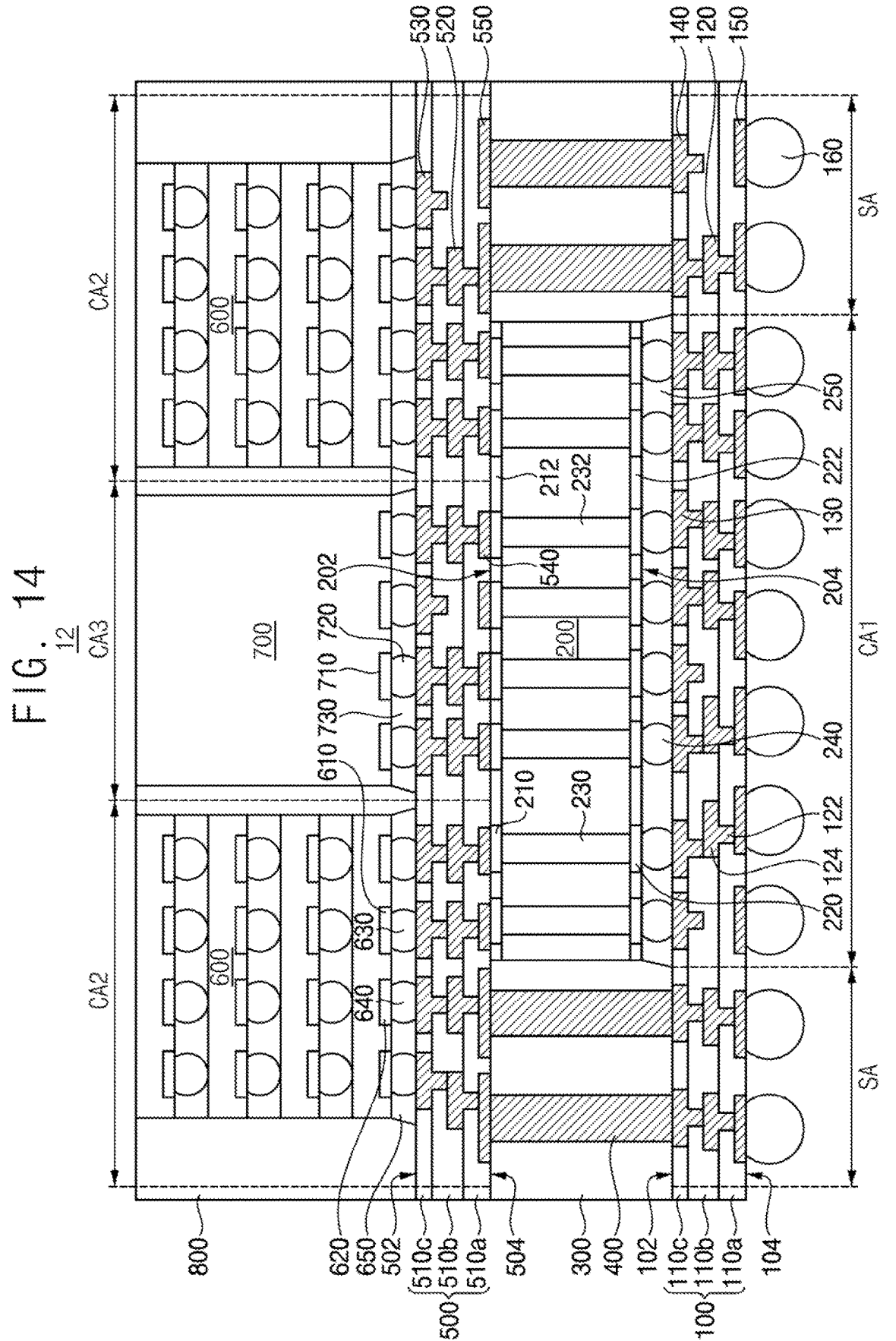
FIG. 14 is a cross-sectional view illustrating a semiconductor package having a logic semiconductor chip in accordance with one or more example embodiments.

FIG. 14 is a cross-sectional view illustrating a semiconductor package 12 having a logic semiconductor chip 200 in accordance with one or more example embodiments. According to one or more example embodiments, the semiconductor package 12 may be substantially the same as or similar to the semiconductor package described with reference to FIGS. 1, 2, 3, and 4 except for a configuration of the logic semiconductor chip 200. Thus, the same or similar components are denoted by the same or similar reference numerals, and repeated descriptions of the same components will be omitted.

Referring to FIG. 14, according to one or more example embodiments, a semiconductor package 12 may include the logic semiconductor chip 200. The logic semiconductor chip 200 may have the first surface 202 and a second surface 204 opposite to the first surface 202. The logic semiconductor chip 200 may include the plurality of first chip pads 210 exposed from the first surface 202, the plurality of second chip pads 220 exposed from the second surface 204, first and second through electrodes 230 and 232 connecting the first and second chip pads 220, and the solder bumps 240 provided on the second chip pads 220, respectively. The logic semiconductor chip 200 may further include the first protective layer 212 that exposes the first chip pads 210 from the first surface 202, and the second protective layer 222 that exposes the second chip pads 220 from the second surface 204.

The first and second through electrodes 230 and 232 may penetrate through the silicon substrate and may be configured to electrically connect the first and second chip pads 210 and 220 to each other. The first and second through electrodes 230 and 232 may be electrically connected to at least some of the lower redistribution wirings 120 of the lower redistribution wiring layer 100. The first and second through electrodes 230, 232 may be electrically connected to the circuit patterns. When other semiconductor devices are mounted on the first surface 202 of the memory semiconductor chip 600, the first and second through electrodes 230 and 232 may electrically connect the circuit patterns of the memory semiconductor chip 600 and the other semiconductor devices.

The first through electrodes 230 may be provided along the outer surface of the logic semiconductor chip 200. The first through electrodes 230 may be provided along the area where the first and second chip mounting regions CA1 and CA2 overlap. The first through electrodes 230 may be provided on the lower redistribution wiring layer 100 to have an area which overlaps the memory semiconductor chip 600 in the vertical direction.

The second through electrodes 232 may be provided in a central region of the logic semiconductor chip 200. The second through electrodes 232 may be provided along an area where the first and third chip mounting regions CA1 and CA3 overlap each other. The second through electrodes 232 may be provided on the lower redistribution wiring layer 100 to have an area which overlaps the dummy chip 700 in the vertical direction.

Figure 15:
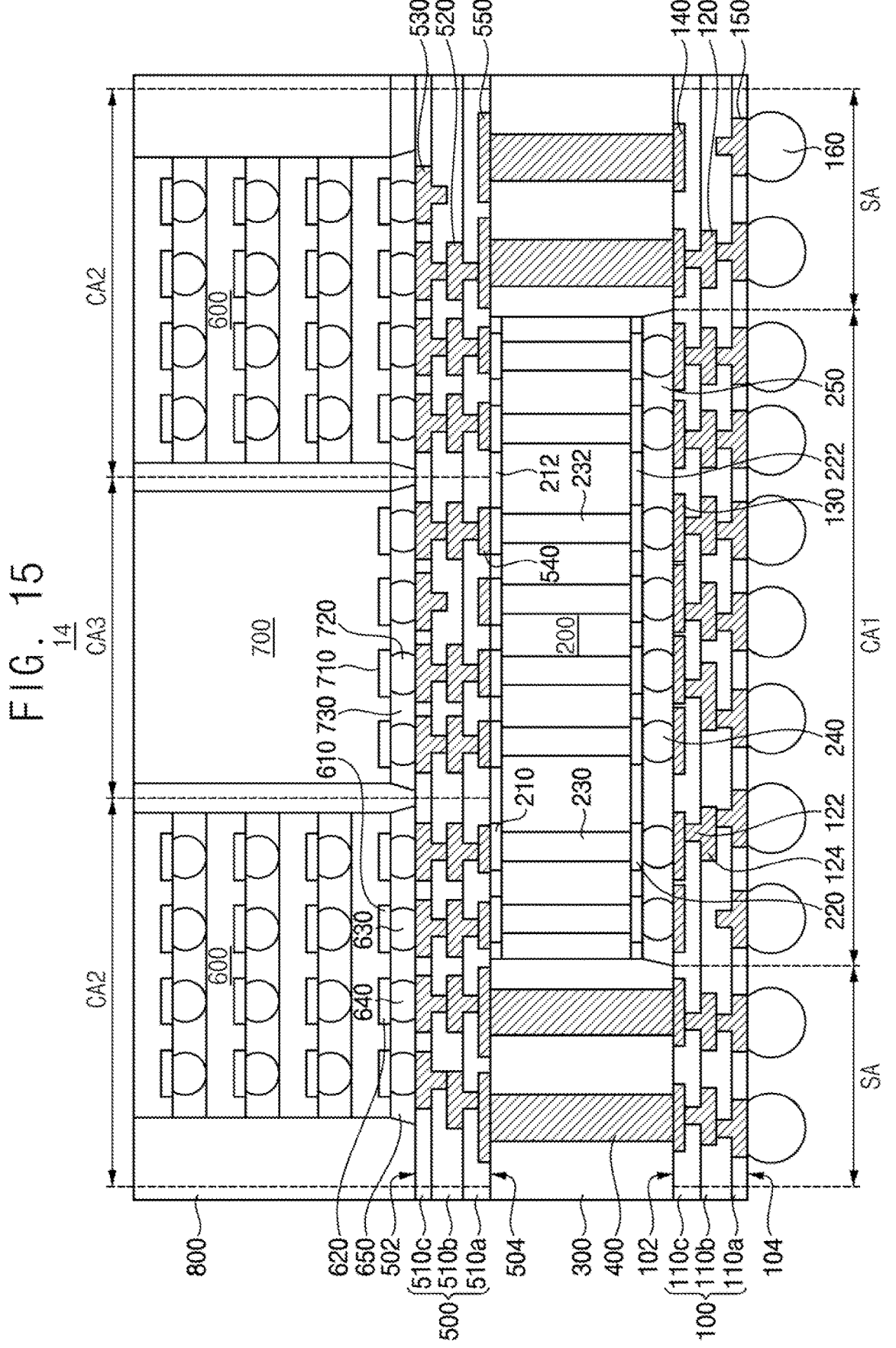
FIG. 15 is a cross-sectional view illustrating a semiconductor package having lower redistribution wirings in accordance with one or more example embodiments.

FIG. 15 is a cross-sectional view illustrating a semiconductor package 14 having lower redistribution wirings 120 in accordance with one or more example embodiments. According to one or more example embodiments, the semiconductor package 14 may be substantially the same as or similar to the semiconductor package described with reference to FIGS. 1, 2, 3, and 4 except for a configuration of the lower redistribution wiring layer. Thus, the same or similar components are denoted by the same or similar reference numerals, and repeated descriptions of the same components will be omitted.

In one or more example embodiments, a semiconductor package 14 may include the lower redistribution wiring layer 100. The lower redistribution wiring layer 100 may include a plurality of the lower redistribution wirings 120. The lower redistribution wiring layer 100 may include the first upper surface 102 and the first lower surface 104 opposite to each other. The lower redistribution wiring layer 100 may include a plurality of first and second bonding pads 130 and 140 provided to be exposed from the upper surface of the lower redistribution wiring layer 100, that is, the first upper surface 102, and a plurality of first connecting pads 150 provided to be exposed from the lower surface of the lower redistribution wiring layer 100, that is, the first lower surface 104.

The lower redistribution wirings 120 may include a redistribution via 124 provided in an opening that penetrates the lower insulating layers 110, and a redistribution line 122 stacked on the redistribution via 24 and extending along the upper surface of the lower insulating layers 110. For example, the redistribution via 124 may be provided on the redistribution line 122 and may extend toward the first upper surface 102 of the lower redistribution wiring layer 100. For example, the semiconductor package 14 may include a chip first structure.

Figure 16:
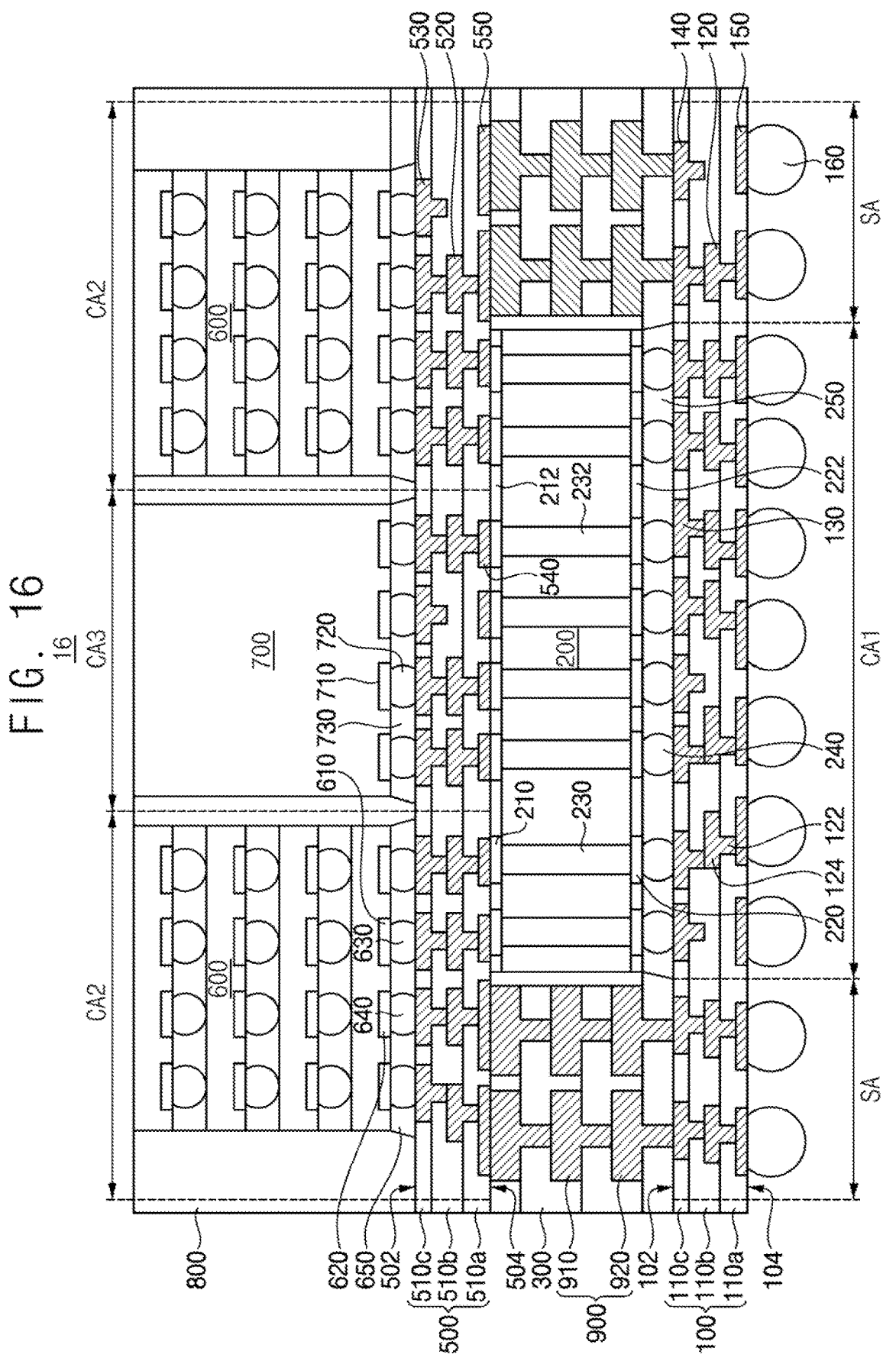
FIG. 16 is a cross-sectional view illustrating a semiconductor package having a conductive layer in accordance with one or more example embodiments.

FIG. 16 is a cross-sectional view illustrating a semiconductor package 16 having a conductive layer 900 in accordance with one or more example embodiments. According to one or more example embodiments, the semiconductor package 16 may be substantially the same as or similar to the semiconductor package described with reference to FIGS. 1, 2, 3, and 4 except for a configuration of the conductive layer. Thus, the same or similar components are denoted by the same or similar reference numerals, and repeated descriptions of the same components will be omitted.

Referring to FIG. 16, according to one or more example embodiments, a semiconductor package 16 may include a conductive layer 900. The conductive layer 900 may include a plurality of insulating layers 920 and conductive wirings 910 provided in the insulating layers 920, respectively. The conductive layer 900 may electrically connect the lower redistribution wiring layer 100 and the upper redistribution wiring layer 500.

Particularly, the conductive wirings 910 may be electrically connected to the second bonding pads 140 of the lower redistribution wiring layer 100. The conductive wirings 910 may be electrically connected to the third connecting pads 550 of the upper redistribution wiring layer 500. The conductive wirings 910 may provide a signal movement path that electrically connects the upper and lower redistribution wiring layers 100 and 500.

In one or more example embodiments, the first sealing member 300 may fill a gap between the logic semiconductor chip 200 and the conductive layer 900 on the lower redistribution wiring layer 100. The first sealing member 300 may be provided on the lower redistribution wiring layer 100 to fill a space between the lower and upper redistribution wiring layers 100 and 500.

The foregoing is illustrative of one or more example embodiments and is not to be construed as limiting one or more example embodiments. Although one or more example embodiments have been particularly described above, it will be apparent to those skilled in the art that various changes in form and details may be made therein without departing from the spirit and scope of the following claims.

What is claimed is:

1. A semiconductor package comprising:
   a lower redistribution wiring layer comprising:
      a first chip mounting region;
      a peripheral region provided at a periphery of the first chip mounting region; and
      lower redistribution wirings;
   a logic semiconductor chip mounted in the first chip mounting region, the logic semiconductor chip comprising a plurality of first through electrodes that are electrically connected to at least some of the lower redistribution wirings;
   a first sealing member covering the logic semiconductor chip on the lower redistribution wiring layer;
   a plurality of conductive connectors penetrating the first sealing member in the peripheral region, and electrically connected to at least some of the lower redistribution wirings;
   an upper redistribution wiring layer provided on the first sealing member, the upper redistribution wiring layer comprising upper redistribution wirings that are electrically connected to the plurality of conductive connectors, and at least one second chip mounting region that overlaps at least a portion of the first chip mounting region when viewed from a plan view; and
   at least one memory semiconductor chip mounted in the at least one second chip mounting region via first conductive bumps and second conductive bumps,
   wherein the first conductive bumps are provided in the first chip mounting region and the at least one second chip mounting region,
   wherein the first conductive bumps are electrically connected to the plurality of first through electrodes, and
   wherein the second conductive bumps are provided in the peripheral region and are electrically connected to the plurality of conductive connectors.

2. The semiconductor package of claim 1, wherein the first conductive bumps are configured to transmit a data signal between the at least one memory semiconductor chip and the logic semiconductor chip,
   wherein the second conductive bumps are electrically connected to the plurality of conductive connectors, and
   wherein the second conductive bumps are configured to transmit a power signal or a ground signal between the at least one memory semiconductor chip and the lower redistribution wiring layer.

3. The semiconductor package of claim 1, wherein the upper redistribution wiring layer further comprises a third chip mounting region provided in the first chip mounting region,
   wherein the third chip mounting region does not overlap with the at least one second chip mounting region, and
   wherein the semiconductor package further comprises at least one dummy chip mounted in the third chip mounting region.

4. The semiconductor package of claim 3, wherein the logic semiconductor chip further comprises a plurality of second through electrodes that are electrically connected to the at least one dummy chip.

5. The semiconductor package of claim 1, wherein each of the second conductive bumps comprises a portion that overlaps at least a portion of the plurality of conductive connectors when viewed from the plan view.

6. The semiconductor package of claim 1, further comprising:
   a second sealing member covering the at least one memory semiconductor chip and provided on the upper redistribution wiring layer.

7. The semiconductor package of claim 1, wherein the lower redistribution wiring layer further comprises a plurality of bonding pads that are exposed from an upper surface of the lower redistribution wiring layer,
   wherein the plurality of bonding pads are electrically connected to the lower redistribution wirings, and
   wherein the lower redistribution wiring layer further comprises:
      a redistribution via electrically connecting the logic semiconductor chip and the plurality of conductive connectors; and
      a redistribution line stacked on the redistribution via.

8. The semiconductor package of claim 7, wherein the plurality of bonding pads are provided on the redistribution line.

9. The semiconductor package of claim 7, wherein the plurality of bonding pads are provided on the redistribution via.

10. The semiconductor package of claim 1, wherein the plurality of conductive connectors comprises:
   a plurality of insulating layers; and
   conductive wirings provided in the plurality of insulating layers.

11. A semiconductor package comprising:
   a lower redistribution wiring layer comprising:
      a first chip mounting region;
      a peripheral region provided at a periphery of the first chip mounting region;
      lower redistribution wirings; and
      bonding pads electrically connected to the lower redistribution wirings;
   a logic semiconductor chip mounted in the first chip mounting region, the logic semiconductor chip comprising a plurality of first through electrodes that are electrically connected to at least some of the lower redistribution wirings;
   a first sealing member covering the logic semiconductor chip and provided on the lower redistribution wiring layer;
   a plurality of conductive connectors penetrating the first sealing member in the peripheral region, and electrically connected to at least some of the lower redistribution wirings;

an upper redistribution wiring layer provided on the first sealing member, the upper redistribution wiring layer comprising:

upper redistribution wirings that are electrically connected to the plurality of conductive connectors;

a second chip mounting region; and a third chip mounting region, wherein the second chip mounting region overlaps at least a portion of the first chip mounting region, and the third chip mounting region does not overlap the second chip mounting region when viewed from a plan view;

at least one memory semiconductor chip provided in the first chip mounting region and the second chip mounting region, the at least one memory semiconductor chip comprises first conductive bumps and second conductive bumps, the first conductive bumps being electrically connected to the plurality of first through electrodes, the second conductive bumps being provided in the peripheral region and electrically connected to the plurality of conductive connectors; and at least one dummy chip mounted in the third chip mounting region.

12. The semiconductor package of claim 11, wherein the first conductive bumps are configured to transmit a data signal between the at least one memory semiconductor chip and the logic semiconductor chip, wherein the second conductive bumps are electrically connected to the plurality of conductive connectors, and wherein the second conductive bumps are configured to transmit a power signal or a ground signal between the at least one memory semiconductor chip and the lower redistribution wiring layer.

13. The semiconductor package of claim 11, wherein the logic semiconductor chip further comprises a plurality of second through electrodes that are electrically connected to the at least one dummy chip.

14. The semiconductor package of claim 11, wherein the second conductive bumps comprise a portion that overlaps at least a portion of the plurality of conductive connectors when viewed from the plan view.

15. The semiconductor package of claim 11, further comprising:

a second sealing member covering the at least one memory semiconductor chip and provided on the upper redistribution wiring layer.

16. The semiconductor package of claim 11, wherein the lower redistribution wirings comprise:

a redistribution via electrically connecting the logic semiconductor chip and the plurality of conductive connectors; and a redistribution line stacked on the redistribution via.

17. The semiconductor package of claim 16, wherein the bonding pads are provided on the redistribution line.

18. The semiconductor package of claim 16, wherein the bonding pads are provided on the redistribution via.

19. The semiconductor package of claim 11, wherein the plurality of conductive connectors comprises:

a plurality of insulating layers; and conductive wirings provided in the plurality of insulating layers.

20. A semiconductor package comprising:

a lower redistribution wiring layer comprising:

a first chip mounting region; and a peripheral region provided at a periphery of the first chip mounting region;

a logic semiconductor chip mounted in the first chip mounting region, the logic semiconductor chip comprising a plurality of through electrodes that are electrically connected to the lower redistribution wiring layer;

a sealing member covering the logic semiconductor chip and provided on the lower redistribution wiring layer;

a plurality of conductive connectors penetrating the sealing member in the peripheral region and electrically connected to the lower redistribution wiring layer;

an upper redistribution wiring layer provided on the sealing member and electrically connected to the plurality of conductive connectors, the upper redistribution wiring layer comprising a second chip mounting region overlapping at least a portion of the first chip mounting region when viewed from a plan view; and at least one memory semiconductor chip mounted in the second chip mounting region, the at least one memory semiconductor chip comprising first conductive bumps and second conductive bumps, wherein the first conductive bumps are provided in the first chip mounting region and the second chip mounting region and are electrically connected to the plurality of through electrodes, and wherein the second conductive bumps are provided in the peripheral region and are electrically connected to the plurality of conductive connectors.

* * * * *